US011915990B2

(12) United States Patent
Kappauf et al.

(10) Patent No.: US 11,915,990 B2
(45) Date of Patent: Feb. 27, 2024

(54) METHOD FOR MANUFACTURING A POWER MODULE UNIT

(71) Applicant: Siemens Aktiengesellschaft, Munich (DE)

(72) Inventors: Daniel Kappauf, Gräfenberg (DE); Stanislav Panicerski, Nuremberg (DE); Jens Schmenger, Forchheim (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/802,396

(22) PCT Filed: Jan. 14, 2021

(86) PCT No.: PCT/EP2021/050622
§ 371 (c)(1),
(2) Date: Aug. 25, 2022

(87) PCT Pub. No.: WO2021/170308
PCT Pub. Date: Sep. 2, 2021

(65) Prior Publication Data
US 2023/0131848 A1  Apr. 27, 2023

(30) Foreign Application Priority Data
Feb. 28, 2020  (EP) ..................................... 20160146

(51) Int. Cl.
*H01L 23/367*   (2006.01)
*B21D 53/02*   (2006.01)
(Continued)

(52) U.S. Cl.
CPC .......... *H01L 23/3672* (2013.01); *B21D 53/02* (2013.01); *H01L 21/4878* (2013.01);
(Continued)

(58) Field of Classification Search
CPC .. H01L 23/3672; H01L 21/4882; B21P 11/00; B21D 39/06; B21D 53/02; B21D 53/025; B21D 53/022; B23P 15/26
See application file for complete search history.

(56) References Cited

U.S. PATENT DOCUMENTS 2,938,846 A * 5/1960 Hix .......................... G21C 3/36
228/232
5,021,129 A * 6/1991 Arbach ................... C23C 18/32
205/167

(Continued)

FOREIGN PATENT DOCUMENTS

CN  204477747 U  7/2015
CN  107743429 A  2/2018
(Continued)

OTHER PUBLICATIONS

PCT International Search Report and Written Opinion of International Searching Authority dated Apr. 23, 2021 corresponding to PCT International Application No. PCT/EP2021/050622 filed Jan. 14, 2021.

*Primary Examiner* — Dale E Page
*Assistant Examiner* — Abbigale A Boyle
(74) *Attorney, Agent, or Firm* — Henry M. Feiereisen LLC

(57) ABSTRACT

In a method of manufacturing a power module unit, cooling fins are positioned in recesses of a frame, in particular a metal frame. A first metallic material is applied to the cooling fins and the frame by a thermal spraying process, causing the applied first metallic material to produce a material bond between the cooling fins and the frame.

14 Claims, 7 Drawing Sheets

(51) Int. Cl.
*H01L 21/48* (2006.01)
*B23D 53/02* (2006.01)
*B23P 15/26* (2006.01)
*F28F 3/02* (2006.01)
*H05K 7/20* (2006.01)

(52) U.S. Cl.
CPC .......... *H01L 21/4882* (2013.01); *B23D 53/02* (2013.01); *B23P 15/26* (2013.01); *F28F 3/02* (2013.01); *H05K 7/2039* (2013.01)

(56) References Cited

U.S. PATENT DOCUMENTS

| | | | | |
|---|---|---|---|---|
| 5,520,976 A * | 5/1996 | Giannetti | | H05K 7/1425 |
| | | | | 264/105 |
| 5,791,045 A * | 8/1998 | Yamamoto | | H01L 23/3732 |
| | | | | 257/E23.103 |
| 5,791,406 A * | 8/1998 | Gonner | | H01L 21/4882 |
| | | | | 165/185 |
| 6,000,462 A * | 12/1999 | Gonner | | H01L 23/3672 |
| | | | | 165/185 |
| 6,085,830 A * | 7/2000 | Mashiko | | H01L 21/4871 |
| | | | | 165/185 |
| 6,208,513 B1 * | 3/2001 | Fitch | | H01L 23/3677 |
| | | | | 257/713 |
| 6,237,222 B1 * | 5/2001 | Chen | | H01L 23/3672 |
| | | | | 29/890.039 |
| 6,907,917 B2 * | 6/2005 | Chu | | H01L 23/373 |
| | | | | 165/185 |
| 6,918,438 B2 * | 7/2005 | Ellsworth, Jr. | | H01L 23/3737 |
| | | | | 165/905 |
| 7,188,661 B2 * | 3/2007 | Mathews | | H01L 21/4882 |
| | | | | 257/E23.103 |
| 7,446,412 B2 * | 11/2008 | Gwin | | G06F 1/20 |
| | | | | 165/185 |
| 7,537,151 B2 * | 5/2009 | Bhatti | | H01L 23/3672 |
| | | | | 156/60 |
| 8,149,007 B2 * | 4/2012 | Chen | | H01L 23/49811 |
| | | | | 324/755.05 |
| 8,955,580 B2 * | 2/2015 | Chen | | F28F 21/02 |
| | | | | 165/185 |
| 9,431,271 B2 * | 8/2016 | Lin | | H01L 21/4882 |
| 10,529,643 B2 * | 1/2020 | Yamamoto | | H01L 21/4882 |
| 2001/0032715 A1 * | 10/2001 | Peng | | B23K 1/0012 |
| | | | | 228/183 |
| 2004/0000391 A1 * | 1/2004 | Getz, Jr. | | F28F 21/02 |
| | | | | 165/185 |
| 2004/0150956 A1 * | 8/2004 | Conte | | H05K 7/1092 |
| | | | | 257/E23.098 |
| 2005/0199371 A1 | 9/2005 | Kemink et al. | | |
| 2007/0053168 A1 * | 3/2007 | Sayir | | H01L 23/367 |
| | | | | 257/E23.105 |
| 2008/0099538 A1 * | 5/2008 | DeBiccari | | C23C 24/04 |
| | | | | 228/245 |
| 2013/0153189 A1 * | 6/2013 | Lin | | B22D 19/0063 |
| | | | | 165/185 |
| 2013/0180688 A1 * | 7/2013 | Lin | | B22D 19/0081 |
| | | | | 164/112 |
| 2018/0087846 A1 | 3/2018 | Remsburg | | |
| 2018/0109015 A1 | 4/2018 | Gregor | | |
| 2019/0105735 A1 | 4/2019 | Brunhuber et al. | | |

FOREIGN PATENT DOCUMENTS

| | | |
|---|---|---|
| CN | 108883489 A | 11/2018 |
| DE | 3518310 A1 | 11/1986 |
| DE | 102006038980 A1 | 3/2008 |
| DE | 102015202196 A1 | 8/2016 |
| EP | 1133793 A1 | 9/2001 |
| JP | H1131771 A | 2/1999 |

* cited by examiner

FIG 5
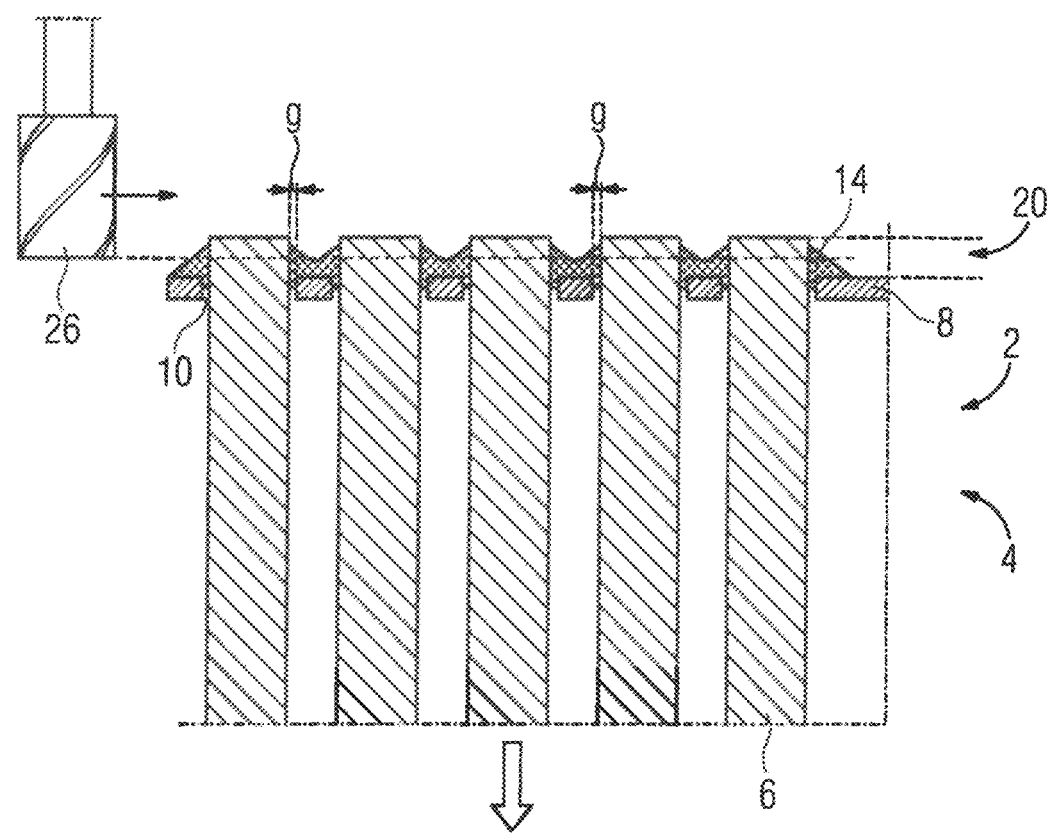
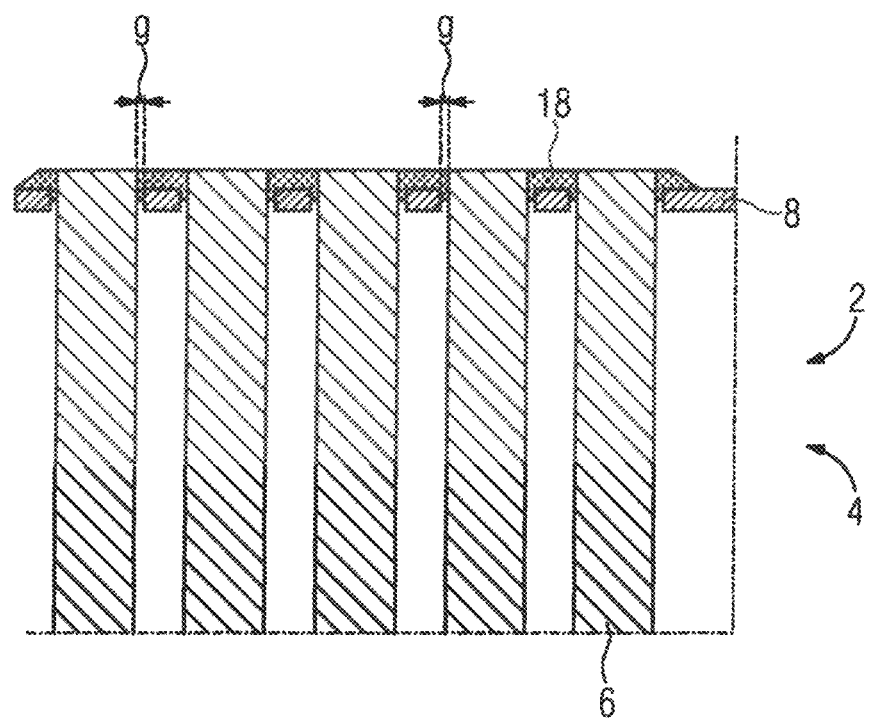

METHOD FOR MANUFACTURING A POWER MODULE UNIT

CROSS-REFERENCES TO RELATED APPLICATIONS

This application is the U.S. National Stage of International Application No. PCT/EP2021/050622, filed Jan. 14, 2021, which designated the United States and has been published as International Publication No. WO 2021/170308 A1 and which claims the priority of European Patent Application, Serial No. 20160146.5, filed Feb. 28, 2020, pursuant to 35 U.S.C. 119(a)-(d).

BACKGROUND OF THE INVENTION

The invention relates to a method for manufacturing a power module unit.

The invention further relates to a heat sink for a power module unit.

The invention also relates to a power module unit comprising at least one such heat sink.

In addition, the invention relates to a converter comprising at least one such power module unit.

Power modules generally comprise a substrate with a power semiconductor, e.g. an IGBT (Insulated-Gate Bipolar Transistor), which is fixedly connected on a substrate. The substrate has a metal structure on both sides, wherein the metal structure is designed to be connected to the power semiconductor on one side and can be fixed to a base plate on the other side.

According to the current state of the art, the base plate is preferably acted upon by a thermally conductive structure and fastened to a heat sink. In order to compensate for thermal effects, complex pre-bending of the base plate is necessary so that the base plate is fixedly connected to the heat sink even at a temperature of more than 100 degrees Celsius. A unit comprising a power module and a heat sink is referred to herein as a power module unit.

Heat sinks according to the prior art have hitherto been cast or produced by extrusion.

Published unexamined German patent application DE 3518310 A1 describes a heat sink for semiconductor components, in particular of extruded lightweight metal, having cooling fins of approximately rod-like cross-section projecting at a distance apart from a base plate, wherein the base plate has main grooves on one surface, in each of which a cooling fin with a mount is fixed by deformation of the section of the base plate close to the mount.

Published unexamined German patent application DE 10 2015 202 196 A1 describes a method for manufacturing a heat sink for a frequency converter, wherein the heat sink comprises a base body with a cooling air duct and a number of cooling fins, wherein the cooling fins are disposed in the cooling air duct. The method has the following steps: producing the cooling fins, inserting the cooling fins in a casting tool, wherein the casting tool defines the shape of the base body, and introducing a molten metal into the casting tool to produce the base body and to produce a material bond between the base body and the cooling fins.

Published unexamined German patent application DE 10 2006 038 980 A1 describes a heat sink for semiconductor components with cooling fins connected to a base plate at a distance from one another and projecting therefrom, each of which is designed as a hollow profile with two parallel fin walls and transverse webs connecting them and are fixed in insertion grooves or similar recesses of the base plate. Each rib wall of the cooling fin has a free insertion end which can be inserted in an insertion groove of the base plate. The strip moldings bordering the insertion groove project from the surface of the base plate and are of different heights. The two insertion ends of the cooling fin are connected by a molded-on transverse web whose distance from the foot edge of the insertion end is shorter than the distance of the head surface of a strip molding of the base plate associated therewith from the lowest point of the insertion groove.

The object of the invention is to improve heat dissipation in a power module unit.

SUMMARY OF THE INVENTION

The object is achieved according to the invention by a method for manufacturing a power module unit, wherein cooling fins are positioned in recesses of a frame, in particular a metal frame, wherein a first metallic material is applied to the cooling fins and the frame by means of a thermal spraying process, wherein a material bond is produced between the cooling fins and the auxiliary frame by means of the applied first metallic material.

This object is further achieved by a heat sink for a power module unit having cooling fins and a frame, in particular a metal frame, wherein the cooling fins are positioned in recesses of the frame, in particular a metal frame, wherein a first metallic material is applied to the cooling fins and the frame by means of a thermal spraying process, wherein a material bond is produced between the cooling fins and the frame by the applied first metallic material.

The object is additionally achieved according to the invention by a power module unit which has at least one such heat sink.

The object is also achieved according to the invention by a converter which has at least one such power module unit.

The advantages and preferred embodiments set forth below with respect to the method can be applied mutatis mutandis to the power module unit and the converter.

The invention is based on the idea of connecting cooling fins by way of a material bond to form a heat sink for a power module unit in order to achieve optimum thermal coupling. The material bond is produced by means of a thermal spraying process. A thermal spraying process is an additive manufacturing process, in particular a coating process, hi which, according to the normative definition (DIN EN 657), additive materials, known as spray additives, are melted off, on or onto inside or outside a spray gun, accelerated in a gas stream in the form of spray particles and propelled onto the surface of the component to be coated. Compared with deposition welding, for example, the component surface is not melted and is therefore only subjected to a low thermal load. Such thermal spraying processes include arc spraying, plasma spraying, flame spraying, laser spraying and cold spraying. Before a first metallic material is applied, the cooling fins are positioned e.g. vertically, i.e. upright, hi recesses of a frame, in particular a metal frame. The frame is made of e.g. aluminum and has hi particular a comb-shaped structure, wherein the cooling fins are disposed between teeth of the comb-shaped structure of the frame. The first metallic material contains e.g. copper and/or aluminum to ensure the greatest possible thermal conductivity. In particular, the first metallic material is applied to the side of the, in particular, comb-shaped frame which has a smaller projection of the cooling fins. For example, the projection on one side of the frame is less than 10%, in particular less than 5%, of the cooling fin length. Application of the first metallic material produces a material bond between the cooling fins and the auxiliary frame, thereby forming the heat sink of the power module unit. The side of the frame coated with the first metallic material can be further processed in a further step, e.g. by machining. The at least one power module can also be disposed on the heat sink. In addition to optimum thermal coupling, such an additive manufacturing process enables a variety of rib geometries and different alloys to be used, in particular for the ribs.

Particularly advantageously, the cooling fins are retained in a form-fitting manner in the frame. This positive locking ensures that the cooling fins are reliably held in place during the application of the first metallic material. In addition, no noticeable distortions occur between the cooling fins and the frame, particularly in comparison with a clamped connection.

In another embodiment, the cooling fins have a profiling, in particular a thickening, at least in the region of the frame, wherein the cooling fins are retained in a form-fitting manner in the frame by the profiling. Such a thickening is, for example, a projection of the cooling fins, in particular on both sides, so that they are positively locked between the teeth of the comb-shaped frame. In particular, the projection is hammerhead-shaped.

In a further embodiment, the cooling fins are loosely positioned in the recesses of the frame and wherein the cooling fins are fixed, in particular in a form-fitting manner, on a side facing away from the frame. Loose positioning means that the cooling fins are not fixed in the frame in a force-fitting manner, e.g. by a clamped connection. Loose positioning optionally involves the frame being at least partially in contact with the cooling fins, in particular in a planar manner. Loose positioning allows tolerances to be compensated. Moreover, extruded standard semi-finished products can be used, in particular when using aluminum cooling fins.

In another embodiment, the cooling fins are disposed adjacent to one another in an upright, equidistant and/or parallel manner. Such an arrangement is simple and inexpensive to manufacture.

Particularly advantageously, the first metallic material is sprayed on by means of cold spraying. Cold spraying is a thermal spraying process wherein the spray particles are accelerated to such a high velocity that, in contrast to other thermal spraying processes, they form a dense and firmly adhering layer upon impact with the substrate even without prior melting. Since the material applied by cold spraying is not melted but deformed by its kinetic energy, the component surface of the stack is subjected to only very low temperature loads in comparison with other thermal spraying processes.

In a further embodiment, an essentially planar first surface is formed by the sprayed-on metallic material, Such a surface can be populated with further components of the power module unit. In particular, a direct connection results in very good thermal properties.

In another embodiment, after the first metallic material has been applied, a first surface is milled off flat. The milling process produces a very smooth surface on which further components of the power module unit can be connected in a mechanically stable manner over a wide temperature range, in particular in a materially bonded manner.

In a further embodiment, a dielectric substrate is applied to the first surface in a materially bonded manner. Such a dielectric substrate contains e.g. a ceramic material such as aluminum oxide and/or aluminum nitride. For example, the dielectric substrate is sintered and/or glued. A direct material bond of the dielectric substrate to the first surface provides optimum thermal coupling.

In another embodiment, a dielectric substrate is applied to the first surface using a thermal spraying process. In particular, cost savings can be achieved using a common tool.

In a further embodiment, a second metallic material is applied to the dielectric substrate. For example, the second metallic material is applied by means of a thermal spraying process. In particular, the second metallic material is applied by means of the same thermal spraying process as the first metallic material. In particular, cost savings can be achieved using a common tool.

In another embodiment, after the second metallic material has been applied to the dielectric substrate, a second surface is milled off flat. The milling process produces a very smooth surface on which, in particular, power semiconductors can be connected in a mechanically stable manner over a wide temperature range, in particular in a materially bonded manner, e.g. by soldering or sintering.

In a further embodiment, at least two cooling fins are disposed in such a way that a ratio of fin length to fin spacing is at least 3, in particular at least 5. Such a ratio of fin length to fin spacing cannot be realized economically by milling, for example, for mechanical reasons. Such a ratio of fin length to fin spacing enables optimum heat dissipation from the power module unit to be achieved in a cost-effective manner.

BRIEF DESCRIPTION OF THE DRAWING

The invention will now be described and explained in more detail with reference to the exemplary embodiments shown in the figures, in which FIG. 5 shows a schematic sectional view of a milling process after application of the first metallic material.

DETAILED DESCRIPTION OF PREFERRED EMBODIMENTS

Figure 1:
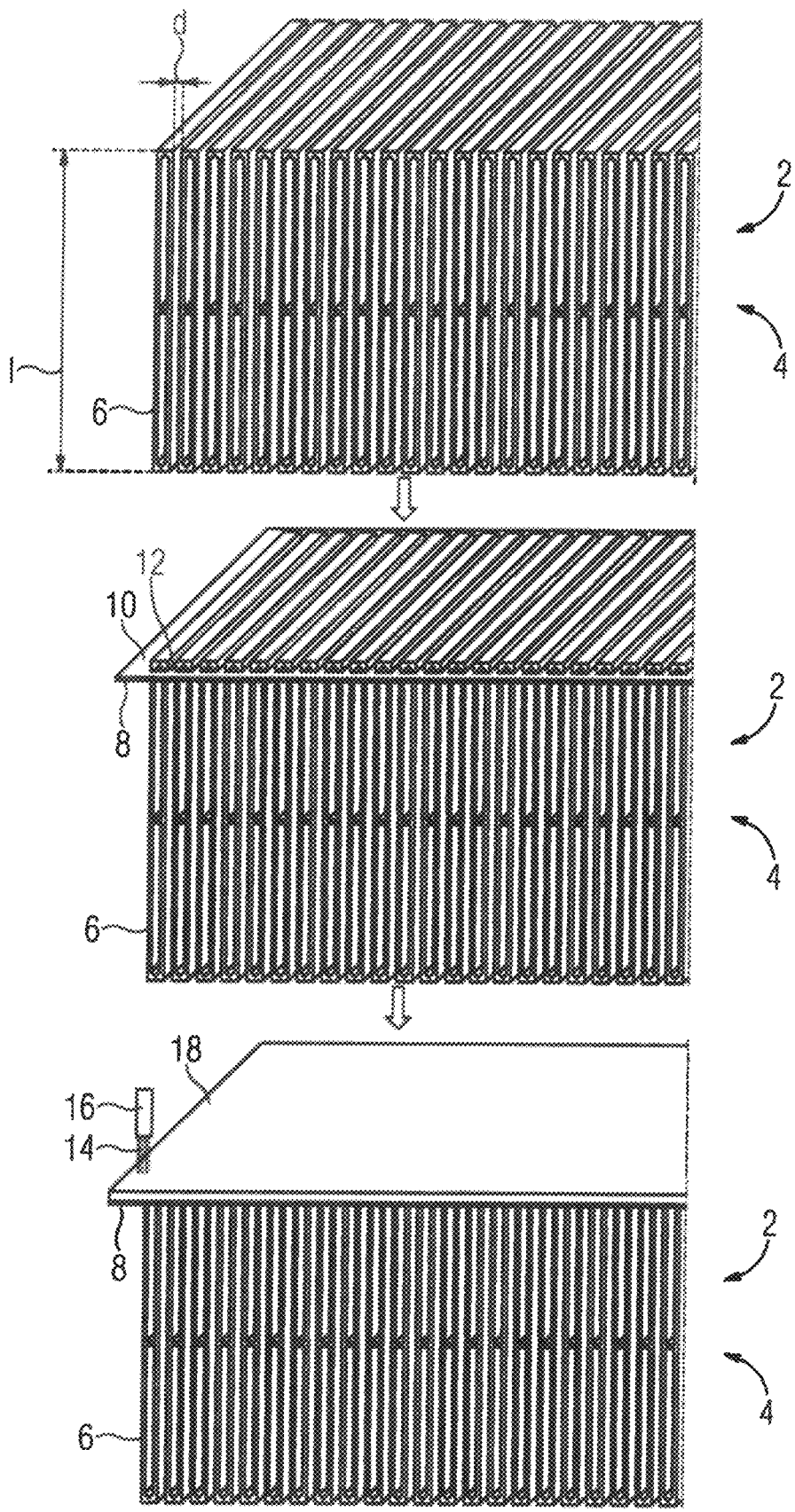
FIG. 1 shows a schematic three-dimensional representation of a process for manufacturing a heat sink for a power module unit.

The exemplary embodiments explained below are preferred embodiments of the invention. In the exemplary embodiments, the described components of the embodiments each represent individual features of the invention that are to be considered independently of one another, each of which also further develops the invention independently of one another and thus is also to be considered a component part of the invention individually or in a combination other than that shown. Furthermore, the described embodiments can also be supplemented by further of the already described features of the invention.

Identical reference characters have the same meaning in the various figures.

FIG. 1 shows a schematic three-dimensional representation of a process for producing a heat sink 2 for a power module unit 4. In a first step, cooling fins 6, which, by way of example, are designed as hollow cooling fins and are produced e.g. from aluminum and/or copper by means of extrusion, are disposed side by side. For example, the cooling fins 6 are disposed in an upright, equidistant and mutually parallel manner, wherein the ratio of fin length l to fin spacing d is at least 3, in particular at least 5. In a subsequent step, a frame 8, in particular a metal frame, is arranged in such a way that the cooling fins 6 are disposed in recesses 10 of the frame 8. The frame, which acts as a base plate, is made e.g. of aluminum and has, in particular, a comb-shaped structure, wherein the cooling fins 6 are disposed between teeth, in particular parallel and equidistant teeth 12, of the comb-shaped structure of the frame 8. A thermal spraying process is used to apply a first metallic material 14 to the cooling fins 6 and the frame 8, wherein the applied first metallic material 14 produces a material bond between the cooling fins 6 and the frame 8. The first metallic material 14 contains, for example, copper and/or aluminum to ensure the greatest possible thermal conductivity. A thermal spraying process is an additive manufacturing process, in particular a coating process in which, according to the normative definition (DIN EN 657), additive materials, the so-called spray additives, are melted off, on or onto inside or outside a spray gun, accelerated in a gas stream in the form of spray particles and projected onto the surface of the component to be coated. In comparison with deposition welding, for example, the component surface is not melted and is therefore only subjected to a low thermal load. For example, the first metallic material 14 is sprayed onto the cooling fins 6 and the frame 8 by means of cold spraying. In cold spraying, the spray particles are accelerated by a spraying device 16, which is shown only schematically in FIG. 1 for reasons of clarity, to such a high velocity that, in contrast to other thermal spraying processes, they form a dense and firmly adhering layer on impact with the substrate even without preceding melting. Since the material applied by cold spraying is not melted but deformed by its kinetic energy, the component surface of the stack is subjected to only very low temperature loads compared to other thermal spraying processes. The sprayed-on first metallic material 14 produces an essentially planar first surface 18 in addition to the material bond. The first surface 18 can be further processed in a further step, e.g. by machining. In addition, at least one power module can be disposed on the first surface 18.

Figure 2:
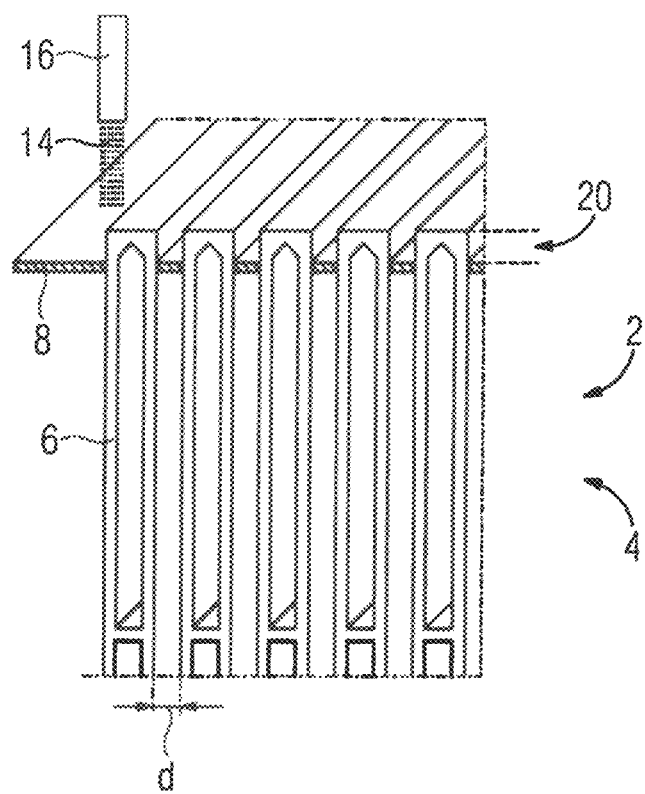
FIG. 2 shows a schematic three-dimensional representation of a first thermal spraying process for manufacturing a heat sink.

FIG. 2 shows a schematic three-dimensional representation of a first thermal spraying process for manufacturing a heat sink 2 for a power module unit 4.

The first metallic material 14 is applied to the side of the, in particular, comb-shaped frame 8 which has a smaller projecting length 20 of the cooling fins 6. For example, the projecting length 20 on one side of the frame 8 is less than 10%, in particular less than 5%, of the cooling fin length l. The rest of the manufacturing process hi FIG. 2 corresponds to that in FIG. 1.

Figure 3:
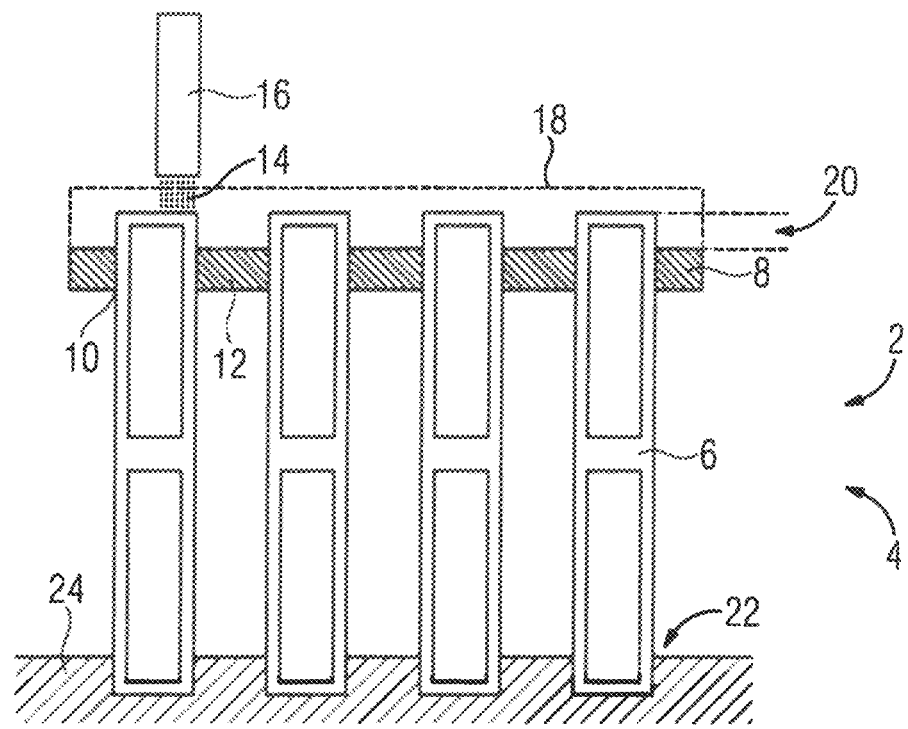
FIG. 3 shows a schematic sectional view of a second thermal spraying process for manufacturing a heat sink.

FIG. 3 shows a schematic sectional view of a second thermal spraying process for manufacturing a heat sink 2. The cooling fins 6 are loosely disposed in the recesses 10 of the frame 8. Loose positioning means that the cooling fins 6 are not fixed in the frame 8 in a force-filling manner, e.g. by a clamped connection. Loose positioning optionally involves the frame 8 being in contact with the cooling fins 6 at least partially, in particular hi a planar manner. The frame 8 is retained horizontally from the outside, wherein a retaining device is not shown for reasons of clarity. The cooling fins 6 are fixed on a side 22 facing away from the frame 8, in particular in a form-filling manner, via a retaining device 23. The rest of the manufacturing process in FIG. 3 corresponds to that in FIG. 2.

Figure 4:
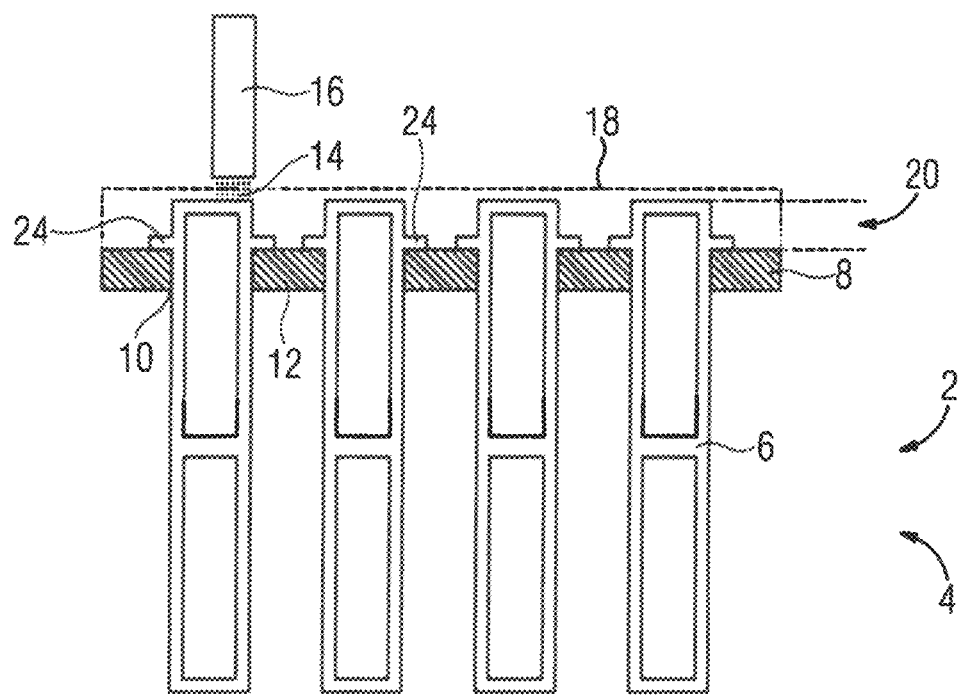
FIG. 4 shows a schematic sectional view of a third thermal spraying process for producing a heat sink.

FIG. 4 shows a schematic sectional view of a third thermal spraying process for manufacturing a heat sink 2. The cooling fins 6 have a profiling 24 in the region of the frame 8. The profiling 24 is designed e.g. as a thickening by which the cooling fins 6 are retained in the frame 8 in a form-filling manner. Such a thickening of the cooling fins 6 on both sides is designed in the shape of a hammer head, for example, so that they are retained in a form-fitting manner between the teeth 12 of the comb-shaped frame 8. The rest of the manufacturing process in FIG. 4 corresponds to that in FIG. 2.

FIG. 5 shows a schematic sectional view of a milling process after the first metallic material has been applied. The cooling fins 6 are loosely disposed in the recesses 10 of the frame 8 and are materially bonded to one another via the first metallic material 14. Between the cooling fins 6 and the frame 8 is a gap g, in particular on both sides, which has a width in the μm range. The gap g is at least partially filled by the first metallic material 14, wherein the filling is achieved by inclining the spray device 16 during the spraying process. The first metallic material 14 is applied as sparingly as possible for reasons of cost, wherein a smooth first surface 18 is obtained by horizontal milling by means of a milling device 26. The rest of the manufacturing process in FIG. 5 corresponds to that in FIG. 2.

Figure 6:
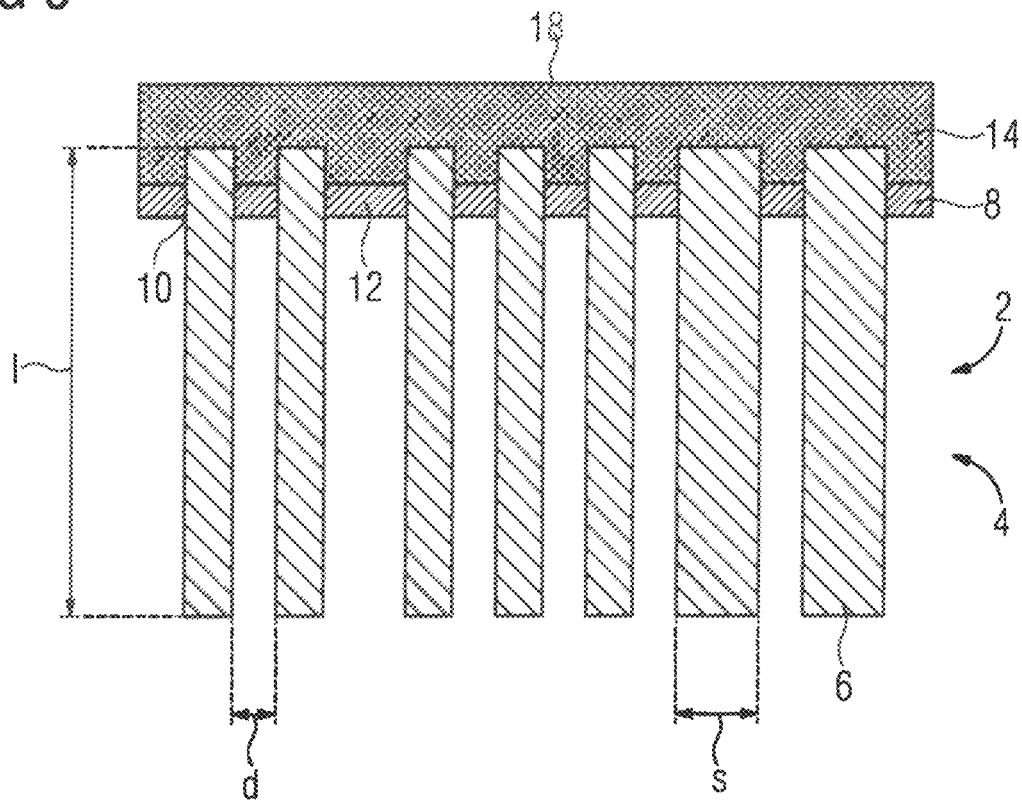
FIG. 6 shows a schematic sectional view of a heat sink with variable thickness and spacing of the cooling fins.

FIG. 6 shows a schematic sectional view of a heat sink 2 with variable thickness s and spacing d of the cooling fins 6. The cooling fins are e.g. of solid design. A ratio of fin length l to minimum fin spacing d is at least 3, in particular at least 5. The rest of the design of the heat sink 2 corresponds to that of FIG. 1.

Figure 7:
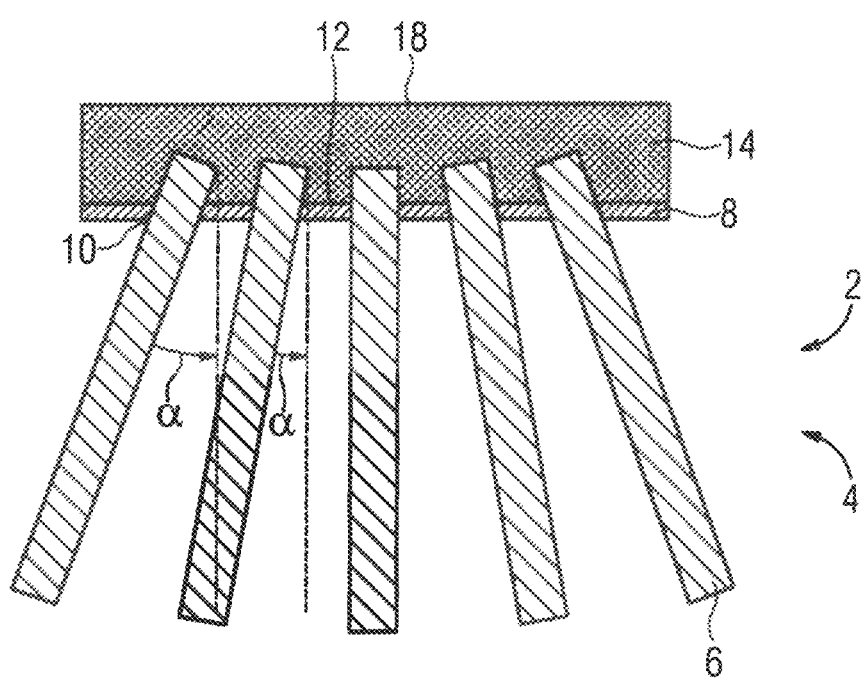
FIG. 7 shows a schematic sectional view of a heat sink with variable angle of the cooling fins.

FIG. 7 shows a schematic sectional view of a heat sink 2 with variable angle α of the cooling fins. In particular, the angle α decreases towards the edges of the heat sink so that better heat dissipation takes place in the central region. The rest of the design of the heat sink 2 corresponds to that shown in FIG. 1.

Figure 8:
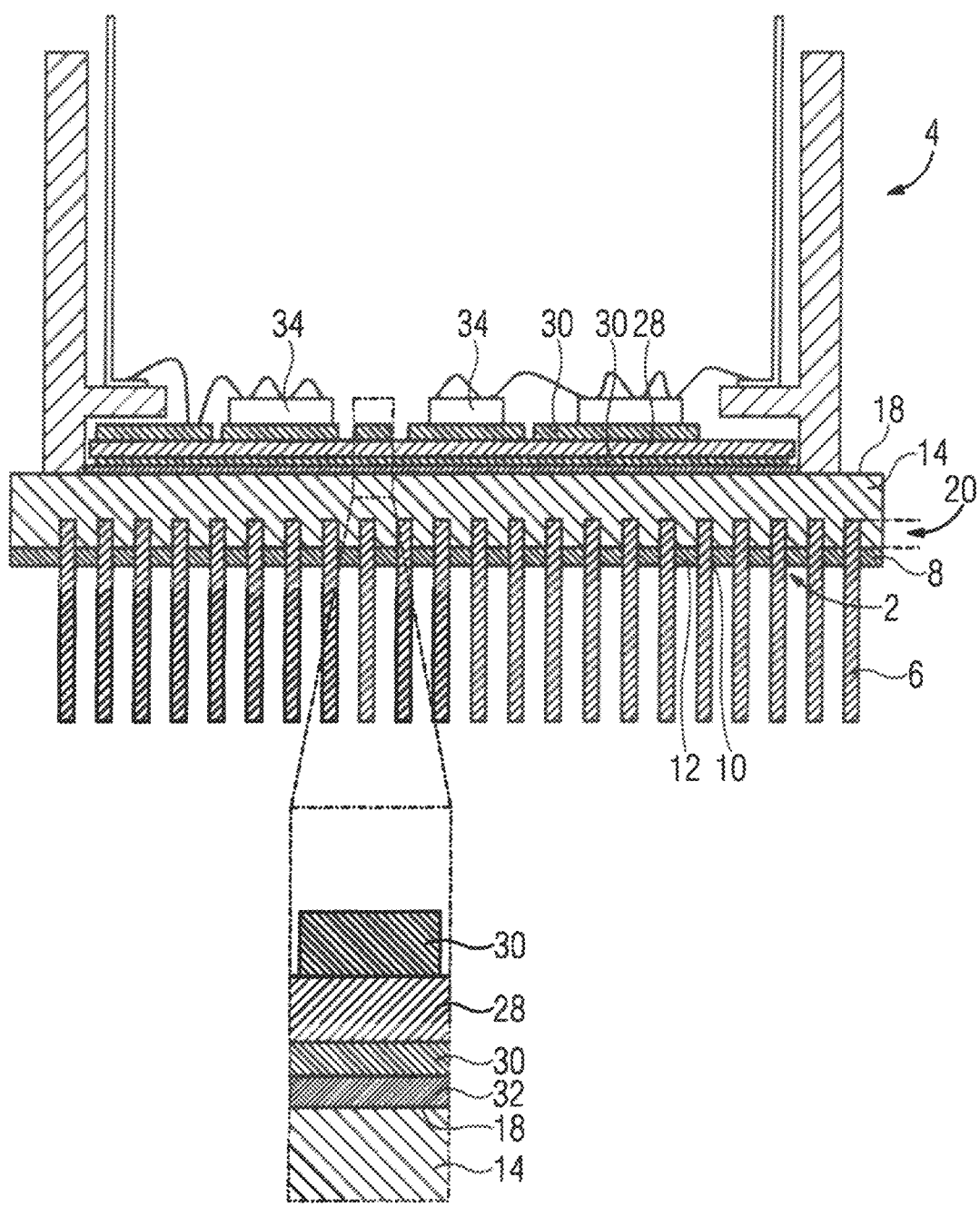
FIG. 8 shows a schematic sectional view of a first embodiment of a power module unit.

FIG. 8 shows a schematic sectional view of a first embodiment of a power module unit 4 with a module-specific heat sink 2. By way of example, the cooling fins 6 of the heat sink 2 contain aluminum and are disposed upright, equidistantly and parallel to each other. The cooling fins 6 are disposed in recesses 10 of the frame 8, which acts as a base plate. The frame 8 is made of aluminum and has a comb-shaped structure, wherein the cooling fins 6 are disposed, in particular in a parallel and equidistant manner, between the teeth 12 of the comb-shaped structure of the frame 8. The first metallic material 14, which is applied by means of a thermal spraying process, in particular by means of cold spraying, and which materially bonds the cooling fins 6 and the frame 8 and forms the first surface 18, contains copper in order to maximize thermal coupling. The rest of the design of the heat sink 2 in FIG. 8 corresponds to that in HG 1. The first surface 18 is optionally smoothed by milling. A dielectric substrate 28 is bonded, in particular materially bonded, to the first surface 18 of the heat sink 2 e.g. by means of soldering, sintering or gluing. The dielectric substrate 28 is made from a ceramic material, for example, in particular from aluminum oxide or aluminum nitride, and comprises on both sides at least partially patterned copper layers 30. The copper layer 30 of the dielectric substrate 28 is bonded to the heat sink, in particular materially bonded thereto, via a bonding layer 32, e.g. a solder layer. On the side of the dielectric substrate 28 facing away from the heat sink 2, power semiconductors 34 are mounted to a patterned copper layer 30 of the dielectric substrate 28, e.g. by soldering or sintering.

Figure 9:
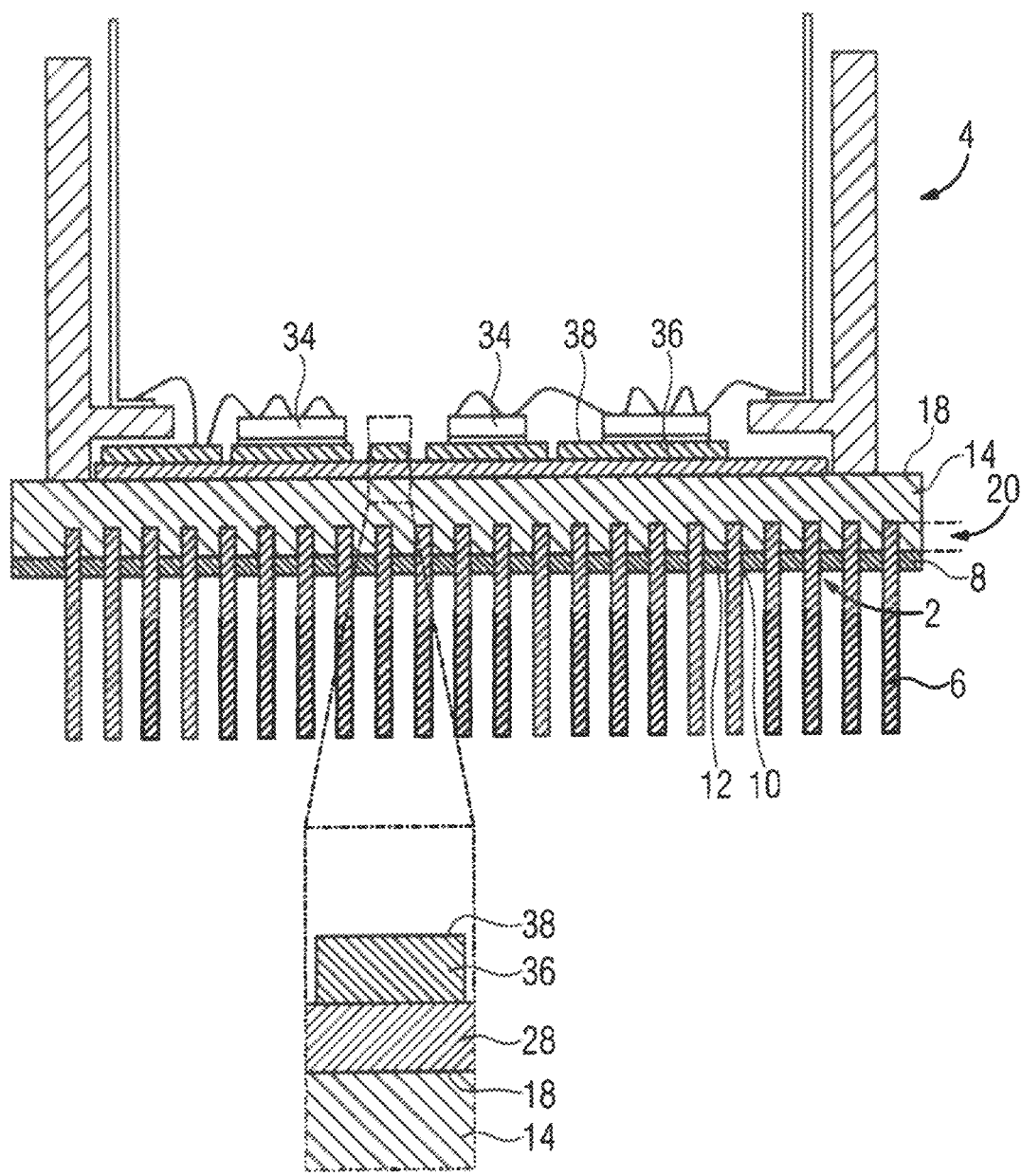
FIG. 9 shows a schematic sectional view of a second embodiment of a power module unit.

FIG. 9 shows a schematic sectional view of a second embodiment of a power module unit 4 with a module heat sink 2. A dielectric substrate 28 is applied to the first surface 18 by means of a thermal spraying process, in particular by cold spraying. The dielectric substrate 28 contains, in particular, microparticles of a ceramic material. For example, aluminum oxide or aluminum nitride microparticles are applied by cold spraying. The thermal spraying process produces a direct connection between the dielectric substrate 28 and the first surface 18, so that no additional copper layer 30 and no bonding layer 32 are required. A second metallic material 36 comprising e.g. copper microparticles is applied directly to the dielectric substrate 28 by means of a thermal spraying process, in particular by means of cold spraying. Patterning is performed additively by omitting areas during the spraying process or subtractively, e.g. by milling. In particular, the second metallic material 36 is applied by means of the same thermal spraying process as the first metallic material 14 and or the dielectric substrate 28. In particular, using a common tool provides cost savings. After the second metallic material 36 is applied to the dielectric substrate 28, a second surface 38 is optionally milled off flat. Power semiconductors 34 are applied to the patterned second surface 38, e.g. by soldering or sintering. The rest of the design of the power module unit 4 corresponds to that shown in FIG. 8.

In summary, the invention relates to a method for manufacturing a power module unit 4. In order to improve cooling of the power module unit 4, it is proposed that cooling fins 6 are positioned in recesses 10 of a frame 8, in particular a metal frame, wherein a first metallic material 14 is applied to the cooling fins 6 and the frame 8 by means of a thermal spraying process, wherein a material bond is produced between the cooling fins 6 and the frame 8 by the applied first metallic material 14.

What is claimed is:

1. A method of manufacturing a power module unit, said method comprising:
    positioning cooling fins in recesses of a frame, in particular a metal frame;
    applying a first metallic material to the cooling fins and the frame by a thermal spraying process, causing the applied first metallic material to produce a material bond between the cooling fins and the frame;
    milling off a first surface flat after the first metallic material has been applied;
    applying a dielectric substrate to the first surface in a materially bonded manner;
    applying a second metallic material to the dielectric substrate; and
    milling off a second surface of the second metallic material flat after applying the second metallic material to the dielectric substrate.

2. The method of claim 1, further comprising retaining the cooling fins in the frame in a form-fitting manner.

3. The method of claim 1, further comprising providing the coaling fins, at least in a region of the frame, with a profiling, in particular a thickening, such that the cooling fins are retained in the frame in a form-fitting manner by the profiling.

4. The method of claim 1, wherein the cooling fins are loosely positioned in the recesses of the frame, and further comprising fixing the cooling fins, in particular in a form-fitting manner, on a side facing away from the frame.

5. The method of claim 1, further comprising disposing the cooling fins adjacent to one another in an upright, equidistant and/or parallel manner.

6. The method of claim 1, wherein the first metallic material is applied by cold spraying.

7. The method of claim 1, wherein an essentially planar first surface is formed by the sprayed-on first metallic material.

8. A method of manufacturing a power module unit, said method comprising:
    positioning cooling fins in recesses of a frame, in particular a metal frame;
    applying a first metallic material to the cooling fins and the frame by a thermal spraying process, causinq the applied first metallic material to produce milling off a first surface flat after the first metallic material has been applied;
    applying a dielectric substrate to the first surface by a thermal spraying process;
    applying a second metallic material to the dielectric substrate; and milling off a second surface of the second metallic material flat after applying the second metallic material to the dielectric substrate.

9. The method of claim 8, further comprising retaining the cooling fins in the frame in a form-fitting manner.

10. The method of claim 8, further comprising providing the cooling fins, at least in a region of the frame, with a profiling, in particular a thickening, such that the cooling fins are retained in the frame in a form-ftting manner by the profiling.

11. The method of claim 8, wherein the cooling fins are loosely positioned in the recesses of the frame, and further comprising fixing the coding fins, in particular in a form-fitting manner, on a side facing away from the frame.

12. The method of claim 8, further comprising disposing the cooling fins adjacent to one another in an upright, equidistant andlor parallel manner.

13. The method of claim 8, wherein the first metallic material is applied by cold spraying.

14. The method of claim 8, wherein an essentialiy planar first surface is formed by the sprayed-on first metallic material.

* * * * *